(12) United States Patent
Ko et al.

(10) Patent No.: US 12,185,479 B2
(45) Date of Patent: Dec. 31, 2024

(54) FLEXIBLE CIRCUIT BOARD AND MANUFACTURING METHOD THEREOF

(71) Applicant: Unimicron Technology Corp., Taoyuan (TW)

(72) Inventors: Cheng-Ta Ko, Taipei (TW); Pu-Ju Lin, Hsinchu (TW); Shih-Chieh Chen, Taoyuan (TW); Chi-Hai Kuo, Taoyuan (TW); Jeng-Ting Li, Pingtung County (TW)

(73) Assignee: Unimicron Technology Corp., Taoyuan (TW)

( * ) Notice: Subject to any disclaimer, the term of this patent is extended or adjusted under 35 U.S.C. 154(b) by 341 days.

(21) Appl. No.: 17/945,106

(22) Filed: Sep. 15, 2022

(65) Prior Publication Data

US 2023/0164928 A1    May 25, 2023

Related U.S. Application Data

(60) Provisional application No. 63/281,085, filed on Nov. 19, 2021.

(30) Foreign Application Priority Data

Aug. 23, 2022 (TW) .................................. 111131699

(51) Int. Cl.
*H05K 1/03* (2006.01)
*H05K 1/11* (2006.01)
(Continued)

(52) U.S. Cl.
CPC ......... *H05K 3/4691* (2013.01); *H05K 1/0393* (2013.01); *H05K 1/118* (2013.01);
(Continued)

(58) Field of Classification Search
CPC .... H05K 1/0393; H05K 1/118; H05K 3/4691; H05K 3/06; H05K 2201/0154; H05K 2201/09509
See application file for complete search history.

(56) References Cited

U.S. PATENT DOCUMENTS

| | | | |
|---|---|---|---|
| 10,638,616 B1 * | 4/2020 | Wu ........................ | H05K 1/118 |
| 2005/0205291 A1 * | 9/2005 | Yamashita ............... | H05K 3/20 |
| | | | 174/262 |

(Continued)

FOREIGN PATENT DOCUMENTS

| | | |
|---|---|---|
| TW | 200631482 | 9/2006 |
| TW | I701981 | 8/2020 |

OTHER PUBLICATIONS

"Office Action of Taiwan Counterpart Application", issued on Jun. 28, 2023, p. 1-p. 5.

*Primary Examiner* — Hoa C Nguyen
(74) *Attorney, Agent, or Firm* — JCIPRNET

(57) ABSTRACT

A flexible circuit board and a manufacturing method thereof are provided. The flexible circuit board includes a circuit structure, a first cover layer, and a second cover layer. The circuit structure has a top surface and a bottom surface opposite to the top surface. The circuit structure includes multiple circuit layers and multiple insulating layers stacked alternately. A material of the insulating layers is a photo-sensitive dielectric material and a Young's modulus of the insulating layers is between 0.36 GPa and 8 GPa. The first cover layer is disposed on the top surface of the circuit structure. The second cover layer is disposed on the bottom surface of the circuit structure.

17 Claims, 3 Drawing Sheets

(51) Int. Cl.
  *H05K 3/06* (2006.01)
  *H05K 3/46* (2006.01)
(52) U.S. Cl.
  CPC ....... *H05K 3/06* (2013.01); *H05K 2201/0154* (2013.01); *H05K 2201/09509* (2013.01)

(56) References Cited

U.S. PATENT DOCUMENTS

| | | | |
|---|---|---|---|
| 2006/0193970 A1* | 8/2006 | Myung | C23C 28/023 427/96.1 |
| 2012/0132458 A1* | 5/2012 | Sekine | H05K 1/0393 174/254 |
| 2017/0339784 A1* | 11/2017 | Zluc | H05K 1/0366 |
| 2019/0380211 A1* | 12/2019 | Lin | H05K 3/4682 |
| 2020/0068721 A1* | 2/2020 | Yang | H01L 23/49827 |
| 2020/0176369 A1* | 6/2020 | Wang | H01L 24/16 |
| 2021/0329777 A1* | 10/2021 | Min | H01Q 9/0407 |
| 2022/0157697 A1* | 5/2022 | Taneda | H01L 23/49833 |

* cited by examiner

FLEXIBLE CIRCUIT BOARD AND MANUFACTURING METHOD THEREOF

CROSS-REFERENCE TO RELATED APPLICATION

This application claims the priority benefit of U.S. provisional application Ser. No. 63/281,085, filed on Nov. 19, 2021, and Taiwan application serial no. 111131699, filed on Aug. 23, 2022. The entirety of each of the above-mentioned patent applications is hereby incorporated by reference herein and made a part of this specification.

BACKGROUND

Technical Field

The disclosure relates to a circuit board and a manufacturing method thereof, and in particular to a flexible circuit board and a manufacturing method thereof.

Description of Related Art

With the advancement of technology, various electronic products are developing towards the trend of being light, thin, short, and small, and flexible electronic products (for example, display devices, wearable devices, communication equipment, etc.) are gradually applied in daily life. At present, the flexible circuit boards applied in the flexible electronic products are usually formed by alternately stacking polyimide layers and copper layers. Since the polyimide layers are not easy to combine with the copper layers, the polyimide layers and the copper layers generally need to be bonded though an adhesive, such that the overall thickness of the flexible circuit board may not be easily reduced. In addition, at present, the circuit layer of the flexible circuit board is manufactured through a subtractive method, such that the line width is greater, which may not be beneficial to the manufacture of a thin circuit or a high-density circuit.

SUMMARY

The disclosure provides a flexible circuit board and a manufacturing method thereof, which can form a flexible circuit board with the design of a high-density circuit, and the overall thickness of the flexible circuit board is significantly reduced.

The flexible circuit board of the disclosure includes a circuit structure, a first cover layer, and a second cover layer. The circuit structure has a top surface and a bottom surface opposite to the top surface. The circuit structure includes multiple circuit layers and multiple insulating layers stacked alternately. A material of the insulating layers is a photosensitive dielectric material and a Young's modulus of the insulating layers is between 0.36 GPa and 8 GPa. The first cover layer is disposed on the top surface of the circuit structure. The second cover layer is disposed on the bottom surface of the circuit structure.

In an embodiment of the disclosure, an elongation of the insulating layers is greater than 20%.

In an embodiment of the disclosure, the circuit structure has a conductive through hole. The first cover layer and the second cover layer respectively expose two ends of the conductive through hole.

In an embodiment of the disclosure, the conductive through hole includes a first opening, a second opening, and a part of the circuit layer plated on sidewalls of the first opening and the second opening. The first opening and the second opening overlap in a direction perpendicular to the top surface.

In an embodiment of the disclosure, the circuit layers include a first circuit layer, a second circuit layer, and a third circuit layer. The first circuit layer is close to the bottom surface of the circuit structure. The second circuit layer is disposed on the first circuit layer. The third circuit layer is disposed on the second circuit layer and is close to the top surface of the circuit structure. The insulating layers include a first insulating layer and a second insulating layer. The first insulating layer is disposed between the first circuit layer and the second circuit layer. The second insulating layer is disposed between the second circuit layer and the third circuit layer.

In an embodiment of the disclosure, a bottom end of the conductive through hole is flush with a bottom surface of the first insulating layer.

In an embodiment of the disclosure, the first opening penetrates the first insulating layer and the first circuit layer, and the second circuit layer extends to the sidewall of the first opening to be electrically connected to the first circuit layer. The second opening penetrates the second insulating layer, and the third circuit layer extends to the sidewall of the second opening to be electrically connected to the second circuit layer.

In an embodiment of the disclosure, the second opening exposes a part of the second circuit layer.

In an embodiment of the disclosure, a bottom surface of the first circuit layer is flush with a part of a bottom surface of the first insulating layer and a bottom surface of the second circuit layer.

In an embodiment of the disclosure, a number of the circuit layers is between 3 and 10 layers.

In an embodiment of the disclosure, there is no adhesive layer between the adjacent circuit layers and insulating layers.

The manufacturing method of the flexible circuit board of the disclosure includes the following steps. A carrier is provided. A circuit structure is formed on the carrier. The circuit structure includes multiple circuit layers and multiple insulating layers stacked alternately. A material of the insulating layers is a photosensitive dielectric material, and a Young's modulus of the insulating layers is between 0.36 GPa and 8 GPa. A first cover layer is formed on the circuit structure. The carrier is removed. Then, a second cover layer is formed on one side of the circuit structure opposite to the first cover layer.

In an embodiment of the disclosure, the step of forming the circuit structure on the carrier includes forming a first circuit layer on the carrier. A first insulating layer is formed on the first circuit layer. A first opening is formed to penetrate the first insulating layer. A second circuit layer is formed on the first insulating layer and extended to a sidewall of the first opening to be electrically connected to the first circuit layer. A second insulating layer is formed on the second circuit layer. A second opening is formed to penetrate the second insulating layer, and the second opening overlaps with the first opening. A third circuit layer is formed on the second insulating layer and extended to a sidewall of the second opening to be electrically connected to the second circuit layer.

In an embodiment of the disclosure, an aperture of the second opening is greater than or equal to an aperture of the first opening.

In an embodiment of the disclosure, there is no adhesive layer between the first circuit layer and the first insulating layer and between the second circuit layer and the second insulating layer.

In an embodiment of the disclosure, a method for forming the first circuit layer, the second circuit layer, or the third circuit layer is a semi-additive process.

In an embodiment of the disclosure, a method for forming the first opening or the second opening includes a lithography etching process.

Based on the above, the flexible circuit board of the disclosure includes the circuit layers and the insulating layers stacked alternately. The material of the insulating layer is a photosensitive dielectric material and has a Young's modulus of 0.36 GPa to 8 GPa. Therefore, the insulating layer can have good flexibility and good adhesion with the circuit layer without using an additional adhesive between the insulating layer and the circuit layer, thereby reducing the overall thickness of the flexible circuit board, which facilitates the miniaturization of product when subsequently applied to an electronic product. In addition, since the circuit layer is formed through the semi-additive process, and the opening or the blind via of the insulating layer may be formed through the lithography process, the high-density wiring design of the circuit structure can be performed, thereby reducing the overall size of the flexible circuit board.

DETAILED DESCRIPTION OF DISCLOSED EMBODIMENTS

Figure 1A:
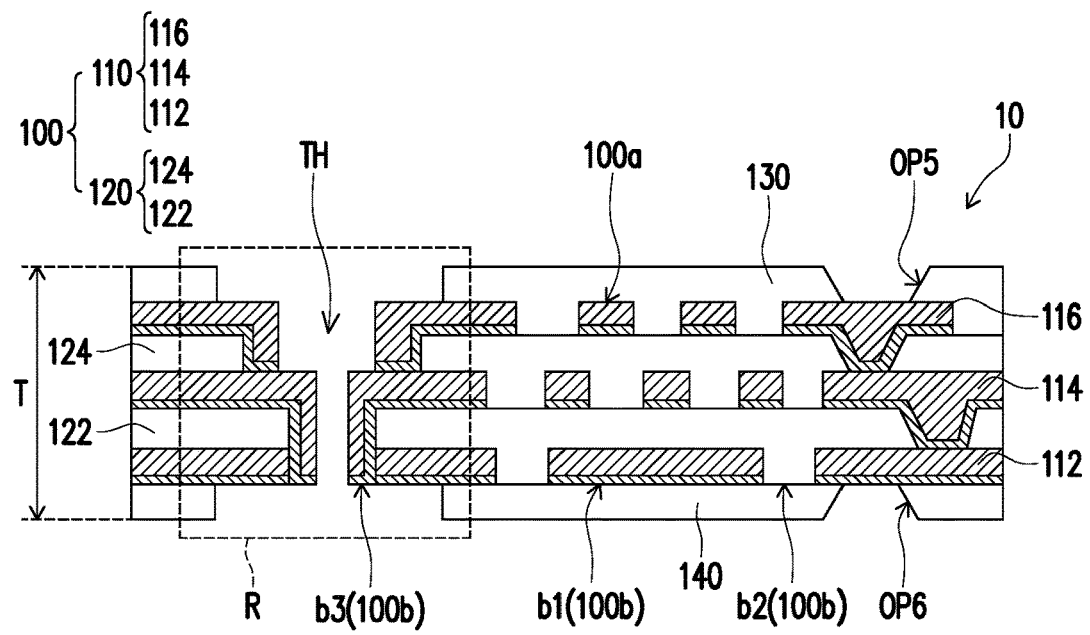
FIG. 1A is a schematic cross-sectional view of a flexible circuit board according to an embodiment of the disclosure.
Figure 1B:
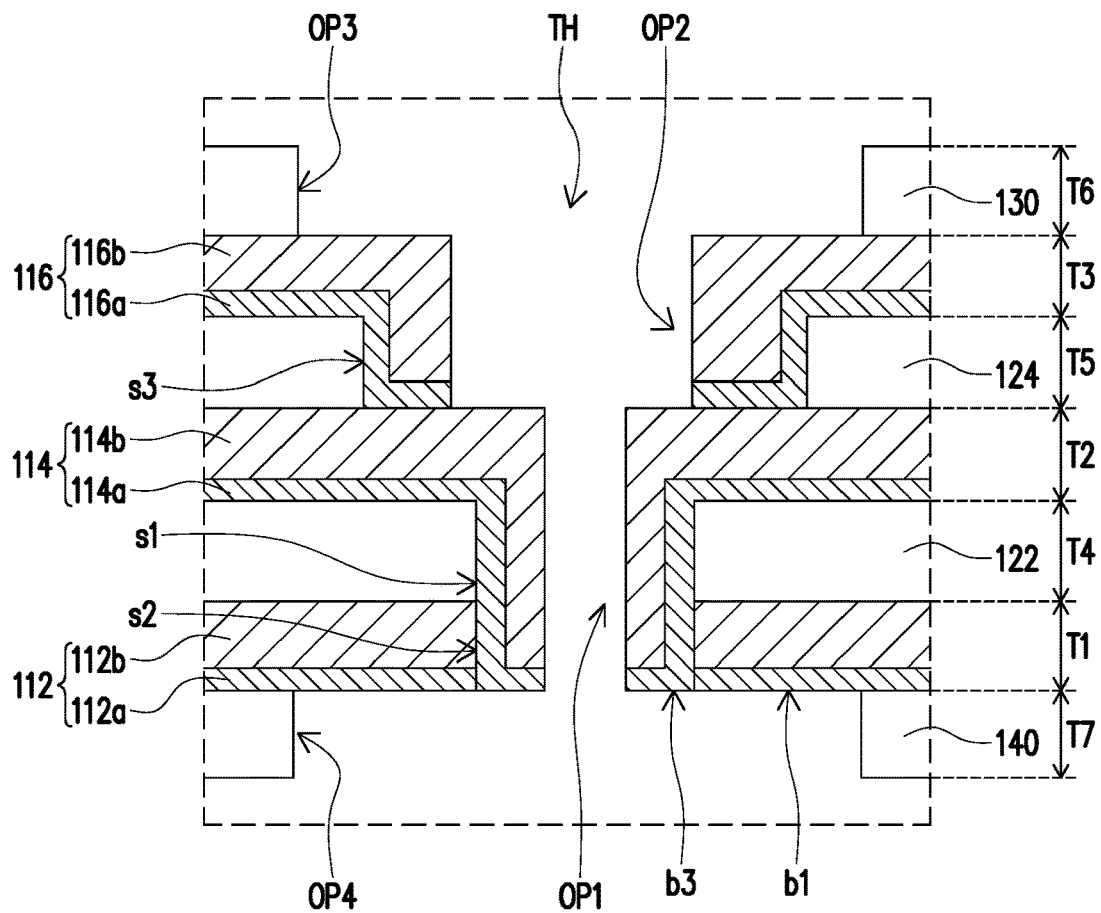
FIG. 1B is a partially enlarged schematic cross-sectional view of a region R in FIG. 1A.

FIG. 1A is a schematic cross-sectional view of a flexible circuit board according to an embodiment of the disclosure. FIG. 1B is a partially enlarged schematic cross-sectional view of a region R in FIG. 1A. Please refer to FIG. 1A and FIG. 1B. A flexible circuit board 10 includes a circuit structure 100, a first cover layer 130, and a second cover layer 140.

The circuit structure 100 has a top surface 100a and a bottom surface 100b opposite to the top surface 100a. The circuit structure 100 includes multiple circuit layers 110 and multiple insulating layers 120 stacked alternately. For example, the circuit layers 110 may include a first circuit layer 112, a second circuit layer 114, and a third circuit layer 116, and the insulating layers 120 may include a first insulating layer 122 and a second insulating layer 124. The first circuit layer 112 is close to the bottom surface 100b of the circuit structure 100. The second circuit layer 114 is disposed on the first circuit layer 112, and the first insulating layer 122 is disposed between the first circuit layer 112 and the second circuit layer 114. In some embodiments, a part of the second circuit layer 114 may penetrate the first insulating layer 122 to be electrically connected to the first circuit layer 112. The third circuit layer 116 is disposed on the second circuit layer 114, and the second insulating layer 124 is disposed between the second circuit layer 114 and the third circuit layer 116. In some embodiments, a part of the third circuit layer 116 may penetrate the second insulating layer 124 to be electrically connected to the second circuit layer 114. The third circuit layer 116 is close to the top surface 100a of the circuit structure 100. In some embodiments, a top surface of the third circuit layer 116 may be regarded as the top surface 100a of the circuit structure 100.

The embodiment schematically shows three layers of the circuit layers 110 and two layers of the insulating layers 120, but is not intended to limit the disclosure. The number of layers of the circuit layers and the insulating layers and the wiring design of the circuit layers may be adjusted according to actual requirements. In some embodiments, the number of layers of the circuit layers 110 may be between 3 and 10 layers, which is beneficial to the volume reduction of the flexible circuit board.

The material of the circuit layer 110 may include copper, silver, gold, an alloy of the above materials, or other suitable metal materials. The material of the insulating layer 120 may be a photosensitive dielectric material and the Young's modulus thereof is between 0.36 GPa and 8 GPa. In this way, the insulating layer 120 can have good flexibility and good adhesion with the circuit layer 110, and it is not necessary to provide an adhesive layer between the insulating layer 120 and the circuit layer 110, thereby reducing the overall thickness of the flexible circuit board. In other words, the adjacent circuit layer 110 and insulating layer 120 may be in direct contact without the adhesive layer.

In some embodiments, the thicknesses of the circuit layers 110 (for example, a thickness T1 of the first circuit layer 112, a thickness T2 of the second circuit layer 114, and a thickness T3 of the third circuit layer 116) may be between 2 μm and 8 μm.

In some embodiments, the thicknesses of the insulating layers 120 (for example, a thickness T4 of the first insulating layer 122 and a thickness T5 of the second insulating layer 124) may be between 2 μm and 8 μm.

In some embodiments, the elongation of the insulating layer 120 is greater than 20% to have good flexibility and bendability.

The first cover layer 130 is disposed on the top surface 100a of the circuit structure 100, and the second cover layer 140 is disposed on the bottom surface 100b of the circuit structure 100. The materials of the first cover layer 130 and the second cover layer 140 may include polyimide, photosensitive cover materials, or other suitable materials. In some embodiments, the Young's moduli of the first cover layer 130 and the second cover layer 140 may be between 0.3 GPa and 3.0 GPa. The first cover layer 130 and the second cover layer 140 have bending resistance to protect the circuit structure 100 from being scratched or polluted by moisture, dust, etc. and provide support for the circuit structure 100.

In some embodiments, a thickness T6 of the first cover layer 130 and a thickness T7 of the second cover layer 140 may be between 20 μm and 50 μm.

In some embodiments, the circuit structure 100 has a conductive through hole TH, and the first cover layer 130 and the second cover layer 140 may respectively expose two ends of the conductive through hole TH. In this way, electronic elements (not shown) disposed on the top surface 100a and the bottom surface 100b of the circuit structure 100 may be directly conducted through the conductive through hole TH to eliminate additional wiring design, so that the electronic elements are easily assembled on the flexible circuit board 10 and the thickness of the circuit structure 100 or the flexible circuit board 10 is reduced.

In some embodiments, the aperture of the conductive through hole TH may be between 15 μm and 25 μm.

In some embodiments, as shown in FIG. 1B, the conductive through hole TH may include a first opening OP1, a second opening OP2, and a part of the circuit layer 110 plated on sidewalls of the first opening OP1 and the second opening OP2, and the first opening OP1 and the second opening OP2 overlap in a direction perpendicular to the first surface 100a. For example, the first opening OP1 may penetrate the first insulating layer 122 and the first circuit layer 112, that is, the first opening OP1 may be defined by an inner side wall s1 of the first insulating layer 122 and an inner side wall s2 of the first circuit layer 112. The second circuit layer 114 may extend to the sidewall of the first opening OP1 (that is, the inner side wall s1 of the first insulating layer 122 and the inner side wall s2 of the first circuit layer 112) to be electrically connected to the first circuit layer 112. The second opening OP2 may penetrate the second insulating layer 124, and the position of the second opening OP2 corresponds to the position of the first opening OP1. In other words, the second opening OP2 may be defined by an inner side wall s3 of the second insulating layer 124, and the first opening OP1 and the second opening OP2 are communicated with each other. The third circuit layer 116 may extend to the sidewall of the second opening OP2 to be electrically connected to the second circuit layer 114.

In some embodiments, the aperture of the second opening OP2 may be slightly greater than the aperture of the first opening OP1, but the disclosure is not limited thereto. In other embodiments, the aperture of the first opening OP1 and the aperture of the second opening OP2 may be equal.

In some embodiments, the first circuit layer 112 may include a first seed layer 112a and a first plating layer 112b disposed on the first seed layer 112a. The second circuit layer 114 may include a second seed layer 114a and a second plating layer 114b disposed on the second seed layer 114a. The third circuit layer 116 may include a third seed layer 116a and a third plating layer 116b disposed on the third seed layer 116a.

In some embodiments, a bottom surface b1 of the first circuit layer 112, a part of a bottom surface b2 of the first insulating layer 122, and a part of a bottom surface b3 of the second circuit layer 114 are flush with each other. In other words, a bottom end of the conductive through hole TH (that is, the bottom surface b3 of the second circuit layer 114) is flush with the bottom surface b2 of the first insulating layer 122 and a part of the bottom surface b3 of the second circuit layer 114, that is, the bottom end of the conductive through hole TH is coplanar with the bottom surface b2 of the first insulating layer 122 and a part of the bottom surface b3 of the second circuit layer 114.

In some embodiments, a part of the bottom surface b1 of the first circuit layer 112, a part of the bottom surface b2 of the first insulating layer 122, and a part of the bottom surface b3 of the second circuit layer 114 may constitute the bottom surface 100b of the circuit structure 100.

In some embodiments, first cover layer 130 includes third opening OP3, and second cover layer 140 includes fourth opening OP4. The third opening OP3 and the fourth opening OP4 overlap with the conductive through hole TH, and the aperture of the third opening OP3 and the aperture of the fourth opening OP4 are respectively greater than the maximum aperture of the conductive through hole TH.

In some embodiments, the first cover layer 130 further includes a fifth opening OP5 to expose a part of the third plating layer 116b of the third circuit layer 116. In some embodiments, the second cover layer 140 further includes a sixth opening OP6 to expose a part of the first seed layer 112a of the first circuit layer 112.

In some embodiments, a thickness T of the flexible circuit board 10 may be between 60 μm and 100 μm.

FIG. 2A to FIG. 2G are schematic cross-sectional views of a manufacturing process of a flexible circuit board according to an embodiment of the disclosure. It must be noted here that the embodiment of FIG. 2A to FIG. 2G continues to use the reference numerals and some content of the embodiment of FIG. 1A and FIG. 1B, wherein the same or similar reference numerals are used to denote the same or similar elements, and the description of the same technical content is omitted. For the description of the omitted part, reference may be made to the foregoing embodiment, which will not be repeated here.

Figure 2A:
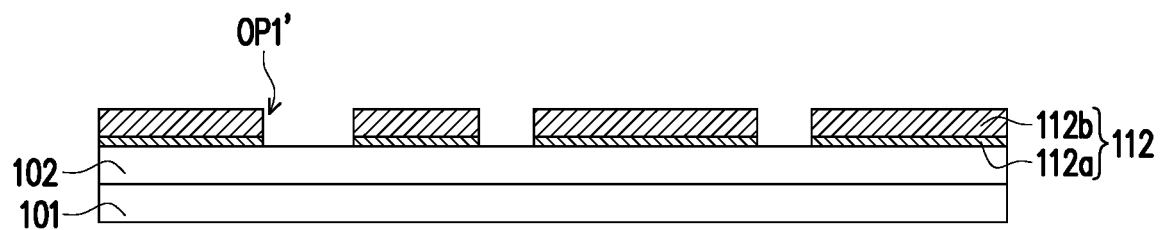
FIG. 2A to FIG. 2G are schematic cross-sectional views of a manufacturing process of a flexible circuit board according to an embodiment of the disclosure.

Please refer to FIG. 2A. A carrier 101 is provided. The carrier 101 may be glass, steel plate, or other suitable materials, and the disclosure is not limited thereto, as long as the carrier 101 can carry a structure formed thereon or a component disposed thereon. Then, a release layer 102 may be formed on the carrier 101, so that the carrier 101 may be separated from a film layer formed in the subsequent process steps by the release layer 102. In some embodiments, the release layer 102 is composed of, for example, a material with weak adhesion. In other embodiments, the adhesion of the material constituting the release layer may be reduced by a thermal process, an ultraviolet (UV) process, a laser process, or other similar processes.

Please refer to FIG. 2A to FIG. 2E. The circuit structure 100 is formed on the carrier 101. In detail, first, as shown in FIG. 2A, the first circuit layer 112 may be formed on the carrier 101. The first circuit layer 112 may be formed through a semi-additive process. For example, through sputtering, the first seed layer 112a may be first formed on the release layer 102, a patterned photoresist layer (not shown) is then formed on the first seed layer 112a to expose the first seed layer 112a of a corresponding circuit pattern, and the first plating layer 112b is then formed on the exposed first seed layer 112a using electroplating. After that, the patterned photoresist layer and the first seed layer 112a located under the patterned photoresist layer are removed to form the first circuit layer 112, wherein the first circuit layer 112 may include an opening OP1' to expose a part of the release layer 102.

Figure 2B:
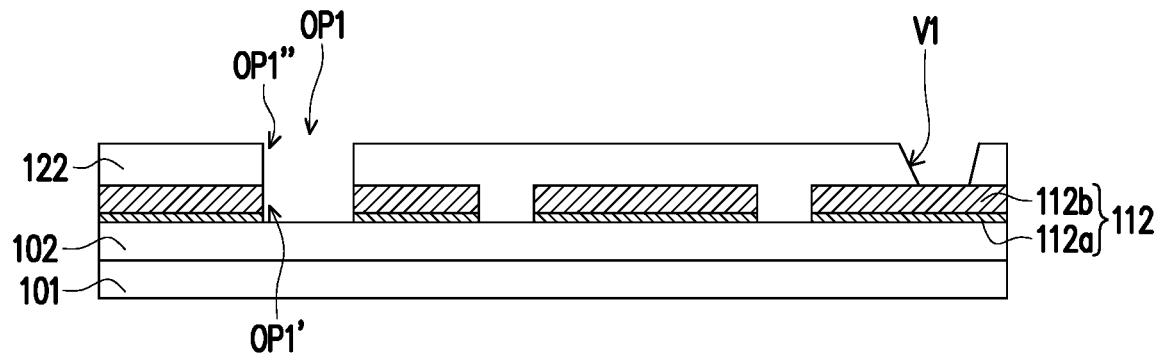

Please refer to FIG. 2B. The first insulating layer 122 is formed on the first circuit layer 112, and the first opening OP1 is formed to penetrate the first insulating layer 122. For example, the first insulating layer 122 may be formed through blade coating, spin coating, or other suitable processes, and an opening OP1" and a blind via V1 may be then formed in the first insulating layer 122. Since the material of the first insulating layer 122 is a photosensitive dielectric material, the opening OP1" and the blind via V1 may be formed through a lithography etching process. For example, a photomask (not shown) may be used as a mask to cure a part of the photosensitive dielectric material by photopolymerization and/or baking. In addition, after curing the part of the photosensitive dielectric material, the remaining uncured photosensitive dielectric material may be removed by wet cleaning or other suitable manners to form the first insulating layer 122 including the opening OP1" and the blind via V1. The first opening OP1 may be composed of the opening OP1' of the first circuit layer 112 and the opening OP1" of the first insulating layer 122, the position of the opening OP1" corresponds to the opening OP1', and the opening OP1" and the opening OP1' are communicated with each other. In some embodiments, the blind via V1 may expose a part of the first circuit layer 112.

In some embodiments, the apertures of the opening OP1" and the blind via V1 may be between 15 μm and 25 μm. Since the first opening OP1 and the blind via V1 of the first insulating layer 122 may be formed through a lithography process, a small aperture opening or blind via may be manufactured, which facilitates the formation of a high-density wiring design.

Figure 2C:
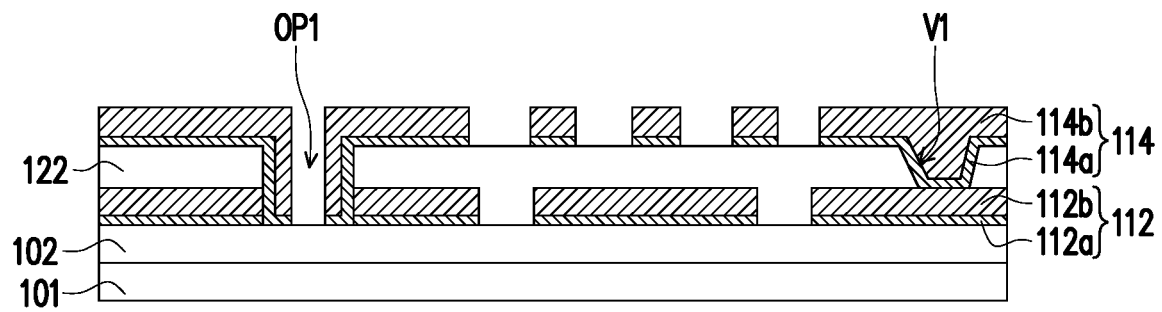

Please refer to FIG. 2C. The second circuit layer 114 is formed on the first insulating layer 122 and extends to the sidewall of the first opening OP1 to be electrically connected to the first circuit layer 112. For example, the second circuit layer 114 may be formed by a method similar to that of the first circuit layer 112. In detail, through sputtering, the second seed layer 114a may be first formed on the first insulating layer 122 and the sidewall of the first opening OP1, a patterned photoresist layer (not shown) is then formed on the second seed layer 114a to expose the second seed layer 114a of a corresponding circuit pattern, and the second plating layer 114b is then formed on the exposed second seed layer 114a using electroplating. After that, the patterned photoresist layer and the second seed layer 114a located under the patterned photoresist layer are removed to form the second circuit layer 114.

In some embodiments, the second circuit layer 114 may fill the blind via V1 to be electrically connected to the first circuit layer 112.

In some embodiments, the second seed layer 114a may also extend to the part of the release layer 102 exposed by the first opening OP1, but the disclosure is not limited thereto.

Figure 2D:
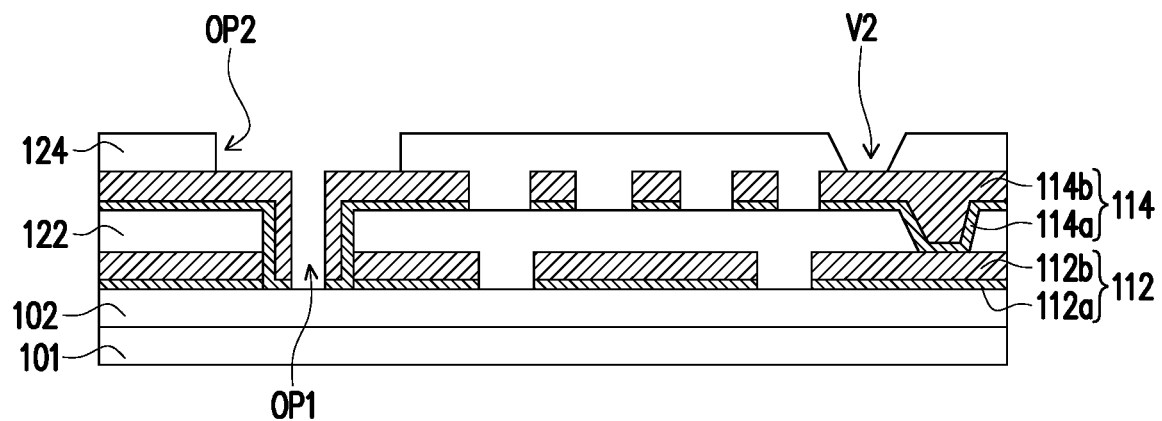

Please refer to FIG. 2D. The second insulating layer 124 is formed on the second circuit layer 114, the second opening OP2 is formed to penetrate the second insulating layer 124, and the second opening OP2 overlaps with the first opening OP1. For example, the second insulating layer 124 may be formed though blade coating, spin coating, or other suitable processes in a manner similar to that of the first insulating layer 122. Then, the second opening OP2 and a blind via V2 may be formed in the second insulating layer 124. Since the material of the second insulating layer 124 is a photosensitive dielectric material, the second opening OP2 and the blind via V2 may be formed through a lithography etching process. The manner for forming the second opening OP2 and the blind via V2 is similar to the manner for forming the opening OP1" and the blind via V1, so details are not repeated here.

In some embodiments, the blind via V2 may expose a part of the second circuit layer 114.

In some embodiments, the second opening OP2 may expose a part of the second circuit layer 114 and the first opening OP1.

In some embodiments, the aperture of the second opening OP2 may be slightly greater than the aperture of the first opening OP1 to facilitate the alignment of the second opening OP2 and the first opening OP1 during the manufacturing process, but the disclosure is not limited thereto. In other embodiments, the aperture of the second opening OP2 may be the same as the aperture of the first opening OP1.

In some embodiments, the apertures of the second opening OP2 and the blind via V2 may be between 15 μm and 20 μm. Since the second opening OP2 and the blind via V2 of the second insulating layer 124 may be formed through the lithography process, a small aperture opening or blind via may be manufactured, which facilitates the implementation of the high-density wiring design.

Figure 2E:
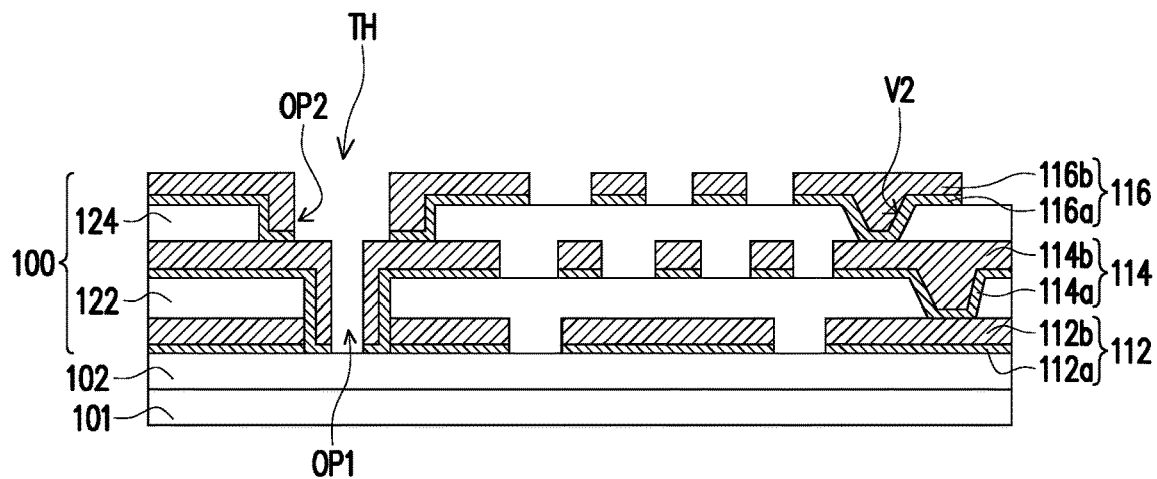

Please refer to FIG. 2E. The third circuit layer 116 is formed on the second insulating layer 124 and extends to the sidewall of the second opening OP2 to be electrically connected to the second circuit layer 114. For example, the third circuit layer 116 may be formed by a method similar to that of the first circuit layer 112. In detail, through sputtering, the third seed layer 116a may be formed on the second insulating layer 124 and the sidewall of the second opening OP2, a patterned photoresist layer (not shown) is then formed on the third seed layer 116a to expose the third seed layer 116a of a corresponding circuit pattern, and the third plating layer 116b is then formed on the exposed third seed layer 116a using electroplating. After that, the patterned photoresist layer and the third seed layer 116a located under the patterned photoresist layer are removed to form the third circuit layer 114.

In some embodiments, the third circuit layer 116 may fill the blind via V2 to be electrically connected to the second circuit layer 114.

In some embodiments, the third seed layer 116a may also extend to the part of the second circuit layer 114 exposed by the opening OP2, but the disclosure is not limited thereto.

Since the circuit layers (the first circuit layer 112, the second circuit layer 114, and the third circuit layer 116) of the embodiment are manufactured using the semi-additive process, a thin circuit may be manufactured. In some embodiments, the line width of the first circuit layer 112, the line width of the second circuit layer 114, and the line width of the third circuit layer 116 may be between 5 μm and 8 μm.

The manufacturing of the circuit structure 100 having three layers of the circuit layers and two layers of the insulating layers may be roughly completed via the above steps. However, the disclosure is not limited thereto, and the above steps may be repeated according to actual requirements to form a circuit structure having more layers of the circuit layers and the insulating layers.

In some embodiments, the second opening OP2 with the sidewall plated with the third circuit layer 116 and the first opening OP1 with the sidewall plated with the second circuit layer 114 may constitute the conductive through hole TH. In this way, an electronic element (not shown) subsequently disposed on one side of the circuit structure 100 may be directly connected to an electronic element (not shown) disposed on the other side of the circuit structure 100 through the conductive through hole TH to simplify the complicated wiring design of the circuit structure 100, so that the assembly of the electronic elements is easy and the thickness of the circuit structure 100 is reduced.

Figure 2F:
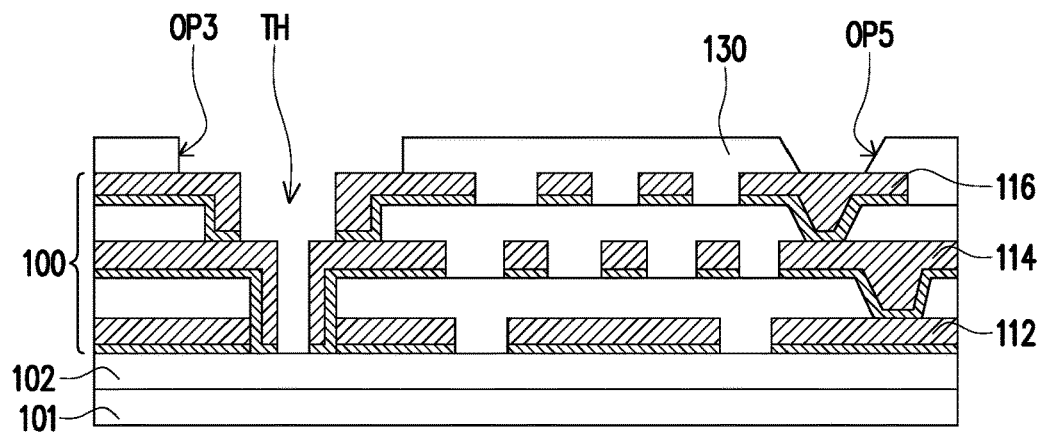

Please refer to FIG. 2F. The first cover layer 130 is formed on the circuit structure 100, wherein the first cover layer 130 includes the third opening OP3 and the fifth opening OP5. For example, if the material of the first cover layer is a polyimide cover film, the third opening OP3 and the fifth opening OP5 may be formed by punching or drilling first, and the polyimide cover film is then disposed on the third circuit layer 116 and the second insulating layer 124 using an alignment bonding manner to form the first cover layer 130. If the material of the first cover layer is a liquid photosensitive cover material, the liquid photosensitive cover material may be disposed on the third circuit layer 116 and the second insulating layer 124 through spin coating or blade coating, and a photomask (not shown) is then used as a mask to cure a part of the photosensitive cover material through photopolymerization and/or baking. After curing the part of the photosensitive cover material, the remaining uncured photosensitive cover material may be removed by wet cleaning or other suitable manners to form the first cover layer 130.

Figure 2G:
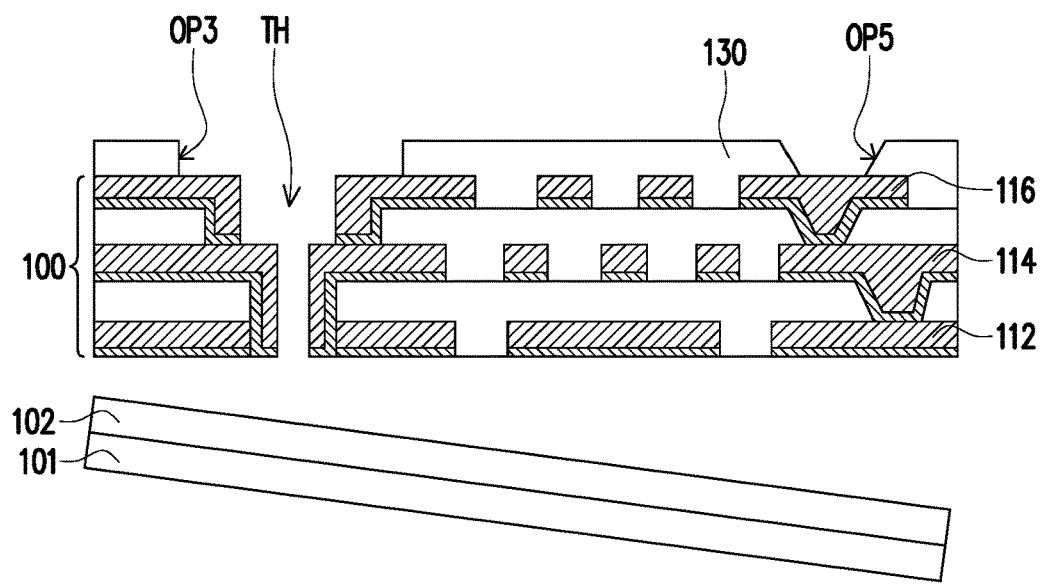

Please refer to FIG. 2G. The carrier 101 is removed. For example, external energy may be applied to the release layer 102 by ultraviolet, laser, visible light, heat, or other manners, so as to reduce the adhesion of the release layer 102, and the release layer 102 and the carrier 101 are then removed at the same time. In some embodiments, the carrier 101 may also be removed by mechanical stripping or other suitable removal processes, which is not limited in the disclosure.

Then, please refer to FIG. 1A. The second cover layer 140 is formed on one side of the circuit structure 100 opposite to the first cover layer 130, wherein the second cover layer 140 includes the fourth opening OP4 and the sixth opening OP6. The manner for forming the second cover layer 140 is similar to that of the first cover layer 130. For example, if the material of the second cover layer 140 is a polyimide cover film, the fourth opening OP4 and the sixth opening OP6 may be formed by punching or drilling first, and the polyimide cover film is then disposed on the first circuit layer 112 and the first insulating layer 122 using an alignment bonding manner to form the second cover layer 140. If the material of the second cover layer 140 is a liquid photosensitive cover material, the liquid photosensitive cover material may be disposed on the first circuit layer 112 and the first insulating layer 122 through spin coating or blade coating, and a photomask (not shown) is then used as a mask to cure a part of the photosensitive cover material through photopolymerization and/or baking. After curing the part of the photosensitive cover material, the remaining uncured photosensitive cover material may be removed by wet cleaning or other suitable manners to form the second cover layer 140.

After the above process, the manufacturing of the flexible circuit board 10 may be substantially completed.

In summary, the flexible circuit board of the disclosure includes the circuit layers and the insulating layers stacked alternately. The material of the insulating layer is a photosensitive dielectric material and has a Young's modulus of 0.36 GPa to 8 GPa. Therefore, the insulating layer can have good flexibility and good adhesion with the circuit layer without using an additional adhesive between the insulating layer and the circuit layer, thereby reducing the overall thickness of the flexible circuit board, which facilitates the miniaturization of product when subsequently applied to an electronic product. In addition, since the circuit layer is formed through the semi-additive process, and the opening or the blind via of the insulating layer may be formed through the lithography process, the high-density wiring design of the circuit structure can be performed, thereby reducing the overall size of the flexible circuit board.

What is claimed is:

1. A flexible circuit board, comprising:
    a circuit structure, having a top surface and a bottom surface opposite to the top surface, wherein the circuit structure comprises a plurality of circuit layers and a plurality of insulating layers stacked alternately, a material of the insulating layers is a photosensitive dielectric material, and a Young's modulus of the insulating layers is between 0.36 GPa and 8 GPa;
    a first cover layer, disposed on the top surface of the circuit structure; and
    a second cover layer, disposed on the bottom surface of the circuit structure.
2. The flexible circuit board according to claim 1, wherein an elongation of the insulating layers is greater than 20%.

3. The flexible circuit board according to claim 1, wherein the circuit structure has a conductive through hole, and the first cover layer and the second cover layer respectively expose two ends of the conductive through hole.

4. The flexible circuit board according to claim 3, wherein the conductive through hole comprises a first opening, a second opening, and a part of the circuit layer plated on sidewalls of the first opening and the second opening, and the first opening and the second opening overlap in a direction perpendicular to the top surface.

5. The flexible circuit board according to claim 4, wherein:
    the circuit layers comprise:
        a first circuit layer, close to the bottom surface of the circuit structure;
        a second circuit layer, disposed on the first circuit layer; and
        a third circuit layer, disposed on the second circuit layer and close to the top surface of the circuit structure,
    wherein the insulating layers comprise:
        a first insulating layer, disposed between the first circuit layer and the second circuit layer; and
        a second insulating layer, disposed between the second circuit layer and the third circuit layer.

6. The flexible circuit board according to claim 5, wherein a bottom end of the conductive through hole is flush with a bottom surface of the first insulating layer.

7. The flexible circuit board according to claim 5, wherein the first opening penetrates the first insulating layer and the first circuit layer, and the second circuit layer extends to the sidewall of the first opening to be electrically connected to the first circuit layer, wherein the second opening penetrates the second insulating layer, and the third circuit layer extends to the sidewall of the second opening to be electrically connected to the second circuit layer.

8. The flexible circuit board according to claim 7, wherein the second opening exposes a part of the second circuit layer.

9. The flexible circuit board according to claim 7, wherein a bottom surface of the first circuit layer is flush with a part of a bottom surface of the first insulating layer and a part of a bottom surface of the second circuit layer.

10. The flexible circuit board according to claim 1, wherein a number of layers of the circuit layers is between 3 and 10 layers.

11. The flexible circuit board according to claim 1, wherein there is no adhesive layer between the adjacent circuit layers and insulating layers.

12. A manufacturing method of a flexible circuit board, comprising:
    providing a carrier;
    forming a circuit structure on the carrier, wherein the circuit structure comprises a plurality of circuit layers and a plurality of insulating layers stacked alternately, a material of the insulating layers is a photosensitive dielectric material, and a Young's modulus of the insulating layers is between 0.36 GPa and 8 GPa;
    forming a first cover layer on the circuit structure;
    removing the carrier; and
    forming a second cover layer on one side of the circuit structure opposite to the first cover layer.

13. The manufacturing method according to claim 12, wherein the step of forming the circuit structure on the carrier comprises:
    forming a first circuit layer on the carrier;
    forming a first insulating layer on the first circuit layer;
    forming a first opening to penetrate the first insulating layer;

forming a second circuit layer on the first insulating layer and extending to a sidewall of the first opening to be electrically connected to the first circuit layer;

forming a second insulating layer on the second circuit layer;

forming a second opening to penetrate the second insulating layer, and overlapping the second opening with the first opening; and forming a third circuit layer on the second insulating layer and extending to a sidewall of the second opening to be electrically connected to the second circuit layer.

14. The manufacturing method according to claim 13, wherein an aperture of the second opening is greater than or equal to an aperture of the first opening.

15. The manufacturing method according to claim 13, wherein there is no adhesive layer between the first circuit layer and the first insulating layer and between the second circuit layer and the second insulating layer.

16. The manufacturing method according to claim 13, wherein a method for forming the first circuit layer, the second circuit layer, or the third circuit layer is a semi-additive process.

17. The manufacturing method according to claim 13, wherein a method for forming the first opening or the second opening comprises a lithography etching process.

\* \* \* \* \*